(12) United States Patent
Saroya et al.

(10) Patent No.: US 11,418,032 B2
(45) Date of Patent: *Aug. 16, 2022

(54) ENERGY MONITORING SYSTEM

(71) Applicant: Willdan Energy Co., Newark, NJ (US)

(72) Inventors: Arjun Saroya, Oakland, CA (US); Stuart James Woolley, Ennistymon (IE); Liam Relihan, Limerick (IE)

(73) Assignee: Willdan Energy Co., Newark, NJ (US)

( * ) Notice: Subject to any disclaimer, the term of this patent is extended or adjusted under 35 U.S.C. 154(b) by 188 days.

This patent is subject to a terminal disclaimer.

(21) Appl. No.: 16/918,622

(22) Filed: Jul. 1, 2020

(65) Prior Publication Data
US 2020/0335971 A1   Oct. 22, 2020

Related U.S. Application Data

(63) Continuation of application No. 16/052,315, filed on Aug. 1, 2018, now Pat. No. 10,734,809.
(Continued)

(51) Int. Cl.
*H02J 3/14* (2006.01)
*H02J 3/28* (2006.01)
(Continued)

(52) U.S. Cl.
CPC ............ *H02J 3/14* (2013.01); *G01R 22/10* (2013.01); *H02J 3/28* (2013.01); *H02J 3/46* (2013.01);
(Continued)

(58) Field of Classification Search
None
See application file for complete search history.

(56) References Cited

U.S. PATENT DOCUMENTS 6,996,508 B1   2/2006   Culp et al.
10,734,809 B2 *   8/2020   Saroya .................. G06Q 50/06
(Continued)

FOREIGN PATENT DOCUMENTS

WO   2019029229 A1   2/2019

OTHER PUBLICATIONS

International Search Report and Written Opinion of PCT/US/44966 dated Oct. 3, 2018.
(Continued)

*Primary Examiner* — Jared Fureman
*Assistant Examiner* — Aqeel H Bukhari
(74) *Attorney, Agent, or Firm* — Winthrop & Weinstine, P.A.

(57) ABSTRACT

An energy monitoring system is provided including a device such as an inductive clamp associated with an electric circuit and configured to measure current load of the electric circuit and an energy monitoring device. The energy monitoring device comprises a processor and a memory including computer program code, the memory and the computer programming code configured to, with the processor, cause the monitoring device to receive circuit data including the measured current from the inductive clamp, determine a Power Set for one or more intermittent loads associated with the electric circuit based at least in part on the circuit data, determine a solution for the circuit data based on determined Solution Sets of the Power Set, and determine an energy usage for an appliance based on the solution.

20 Claims, 11 Drawing Sheets

US 11,418,032 B2
Page 2

Related U.S. Application Data

(60) Provisional application No. 62/541,220, filed on Aug. 4, 2017.

(51) Int. Cl.
*H02J 3/46* (2006.01)
*H02J 13/00* (2006.01)
*G01R 22/10* (2006.01)

(52) U.S. Cl.
CPC ..... *H02J 13/00007* (2020.01); *H02J 2310/14* (2020.01)

(56) References Cited

U.S. PATENT DOCUMENTS

| | | | | |
|---|---|---|---|---|
| 2008/0154523 | A1* | 6/2008 | Gilbert | G06F 8/656 702/62 |
| 2011/0301894 | A1* | 12/2011 | Sanderford, Jr. | G01D 4/004 702/65 |
| 2012/0072389 | A1 | 3/2012 | Aldridge et al. | |
| 2014/0163761 | A1* | 6/2014 | Kuhns | H02J 4/00 700/295 |
| 2016/0091538 | A1* | 3/2016 | Ishihara | G01R 21/06 324/108 |

OTHER PUBLICATIONS

European Search Opinion in Application EP 18841855.2 dated Mar. 25, 2021.
European Search Report in Application EP 18841855.2 dated Mar. 17, 2021.

\* cited by examiner

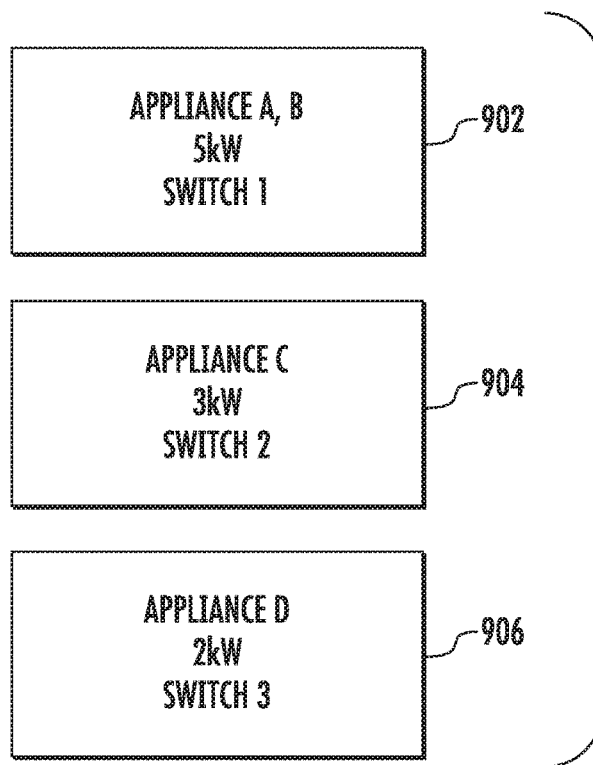

ENERGY MONITORING SYSTEM

CROSS-REFERENCE TO RELATED APPLICATIONS

This application is a continuation application claiming priority from U.S. patent application Ser. No. 16/052,315, filed on Aug. 1, 2018, which claims priority from U.S. provisional patent application No. 62/541,220, filed on Aug. 4, 2017, in the United States Patent and Trademark Office. The disclosures of which are incorporated herein by reference in their entireties.

TECHNICAL FIELD

The present invention generally relates to electrical monitoring and, more particularly, relates to an energy monitoring system for one or more electrical circuits.

BACKGROUND OF THE INVENTION

Typically to determine the energy use of one or more electrical circuits of a building, a current meter is wired into an electrical distribution system. The current meter may record the current load on the electrical circuit as switches are manipulated to map the electrical distribution system and current load for each circuit and/or appliance. The circuit map may be used to give rough estimates of the energy used by the circuits and/or appliances based on assumptions regarding run time for the associated appliances.

SUMMARY OF THE INVENTION

In an example embodiment, an energy monitoring system is provided including an inductive clamp associated with an electric circuit and configured to measure current load of the electric circuit with an energy monitoring device. The energy monitoring device comprises a processor and a memory including computer program code, the memory and the computer programming code configured to, with the processor, cause the monitoring device to receive circuit data including the measured current from the inductive clamp, determine a Power Set for one or more intermittent loads associated with the electric circuit based at least in part on the circuit data, determine a solution for the circuit data based on determined Solution Sets of the Power Set, and determine an energy usage for an appliance based on the solution.

In another example embodiment, an energy monitoring device comprises a processor and a memory including computer program code, the memory and the computer programming code configured to, with the processor, cause the monitoring device to receive circuit data including the measured current from an inductive clamp associated with an electric circuit and configured to measure current drawn by the electric circuit. The circuit data is received via a wireless gateway configured to wirelessly communicate the circuit data from the inductive clamp to the energy monitoring device. The memory and the computer program code are further configured to determine a Power Set for one or more intermittent loads associated with the electric circuit based at least in part on the circuit data, determine a solution for the circuit data based on determined Solution Sets of the Power Set, determine an energy usage for an appliance based on the solution, determine a retrofit power savings based on the energy usage for the appliance and a retrofit energy use for the appliance, and cause the retrofit power savings and the power use of the appliance to be displayed on a user interface.

BRIEF DESCRIPTION OF THE DRAWINGS

Figure 1:
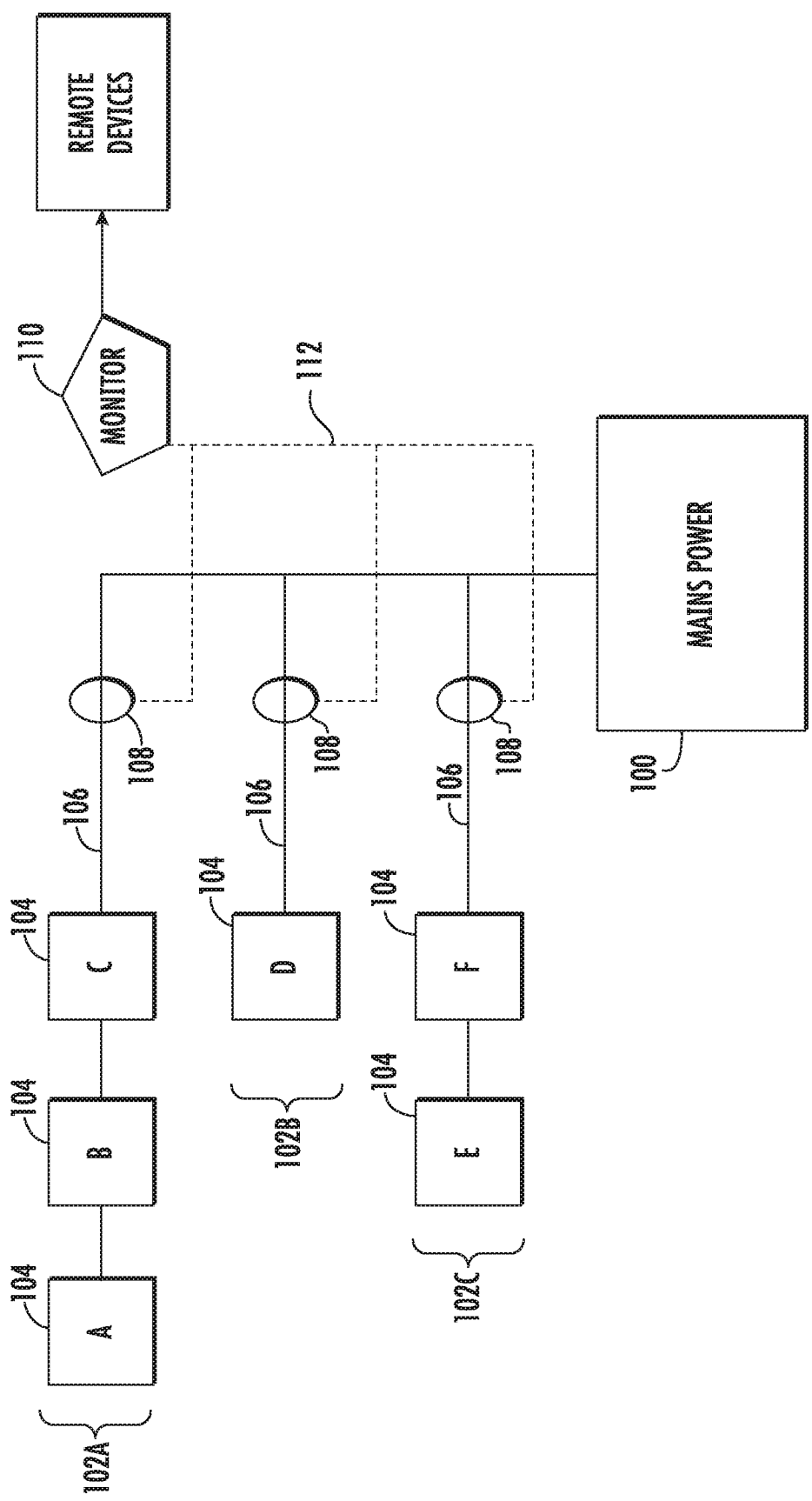
Figure 2:
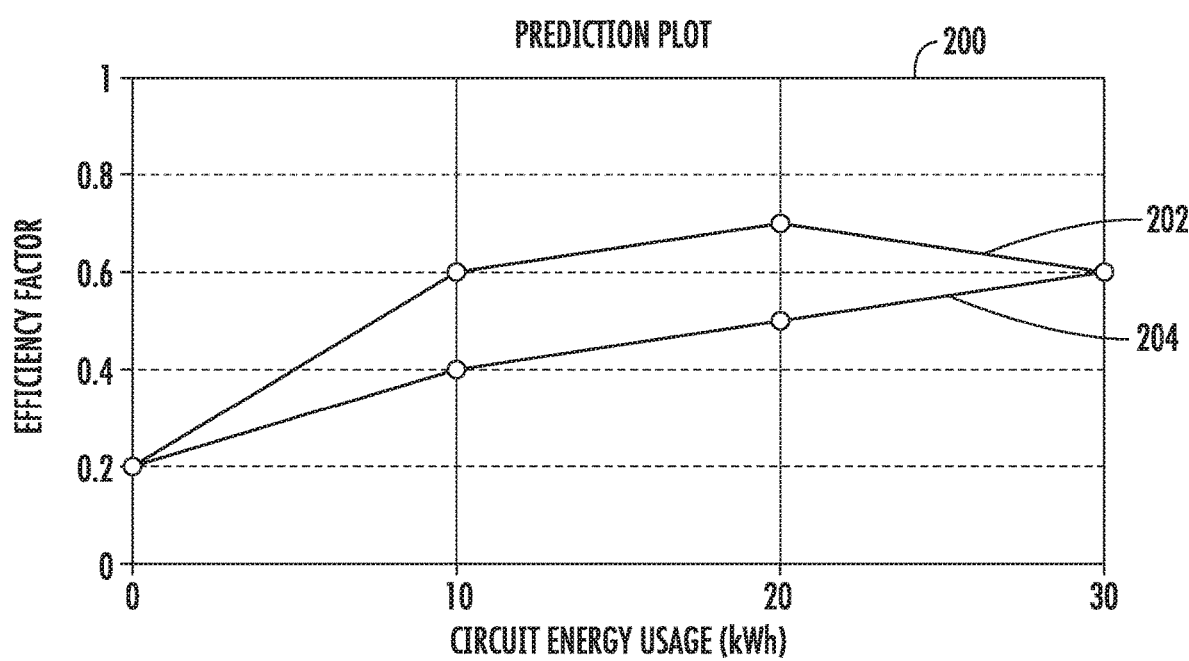
Figure 3:
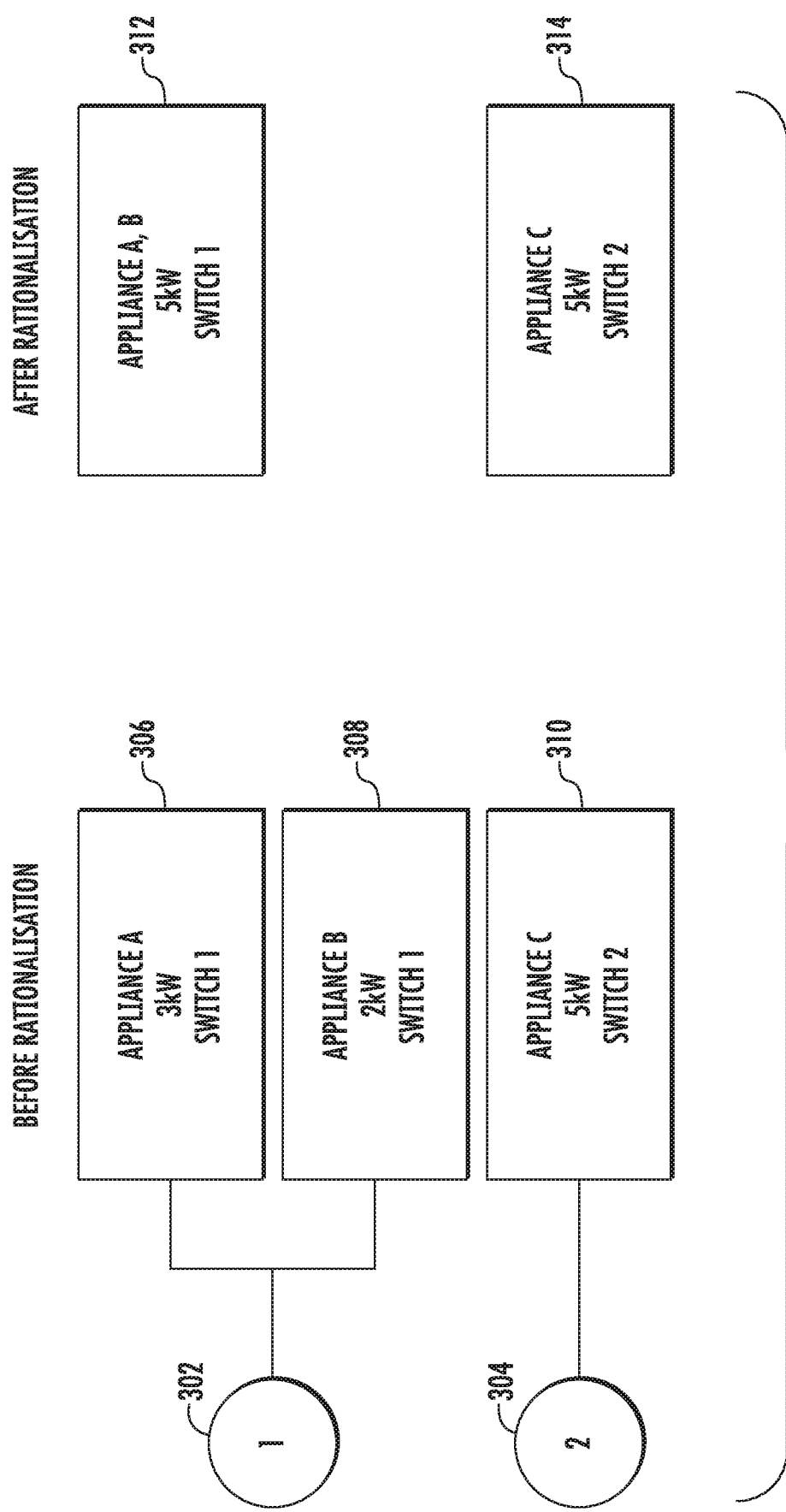
Figure 4:
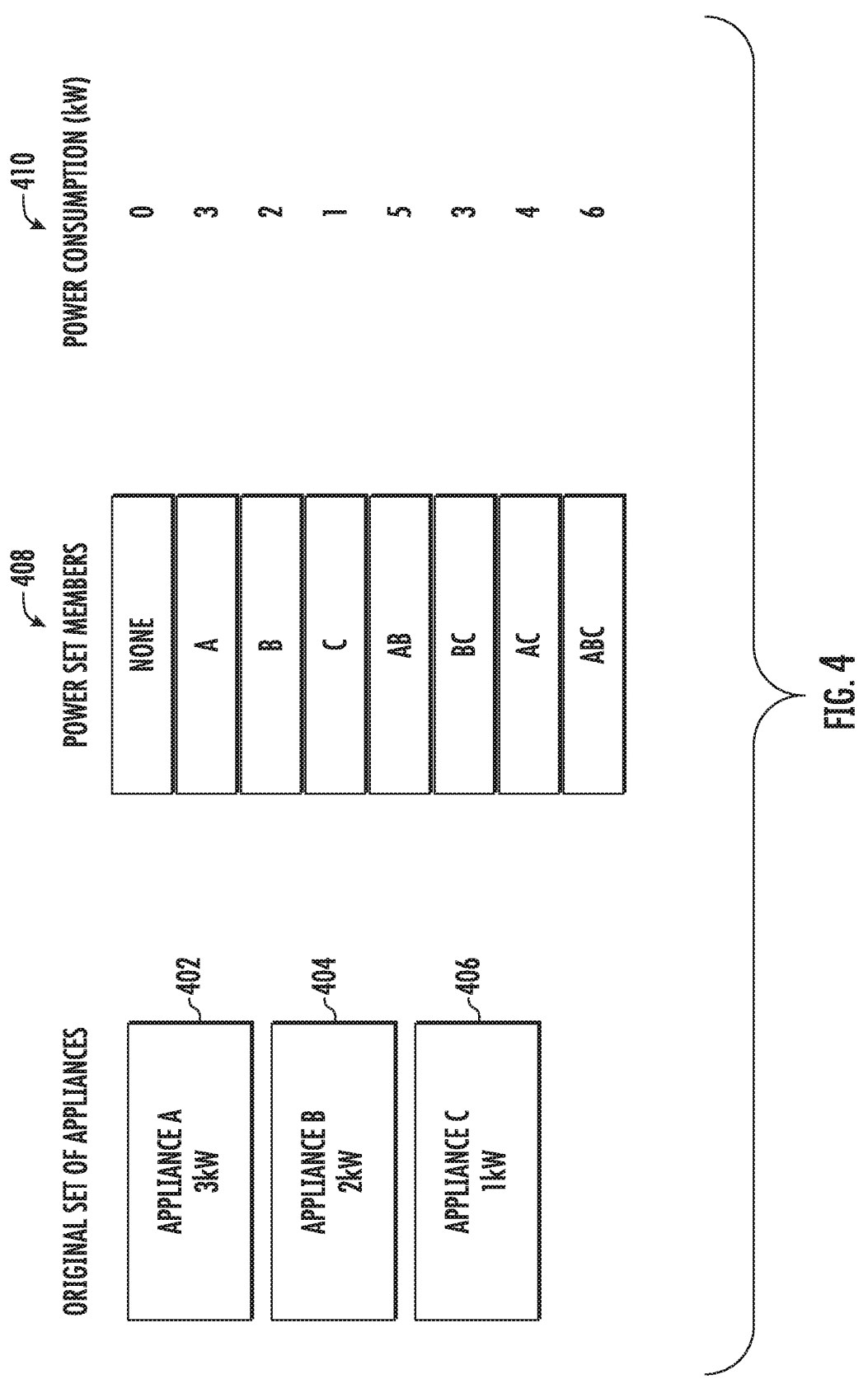
Figure 5:
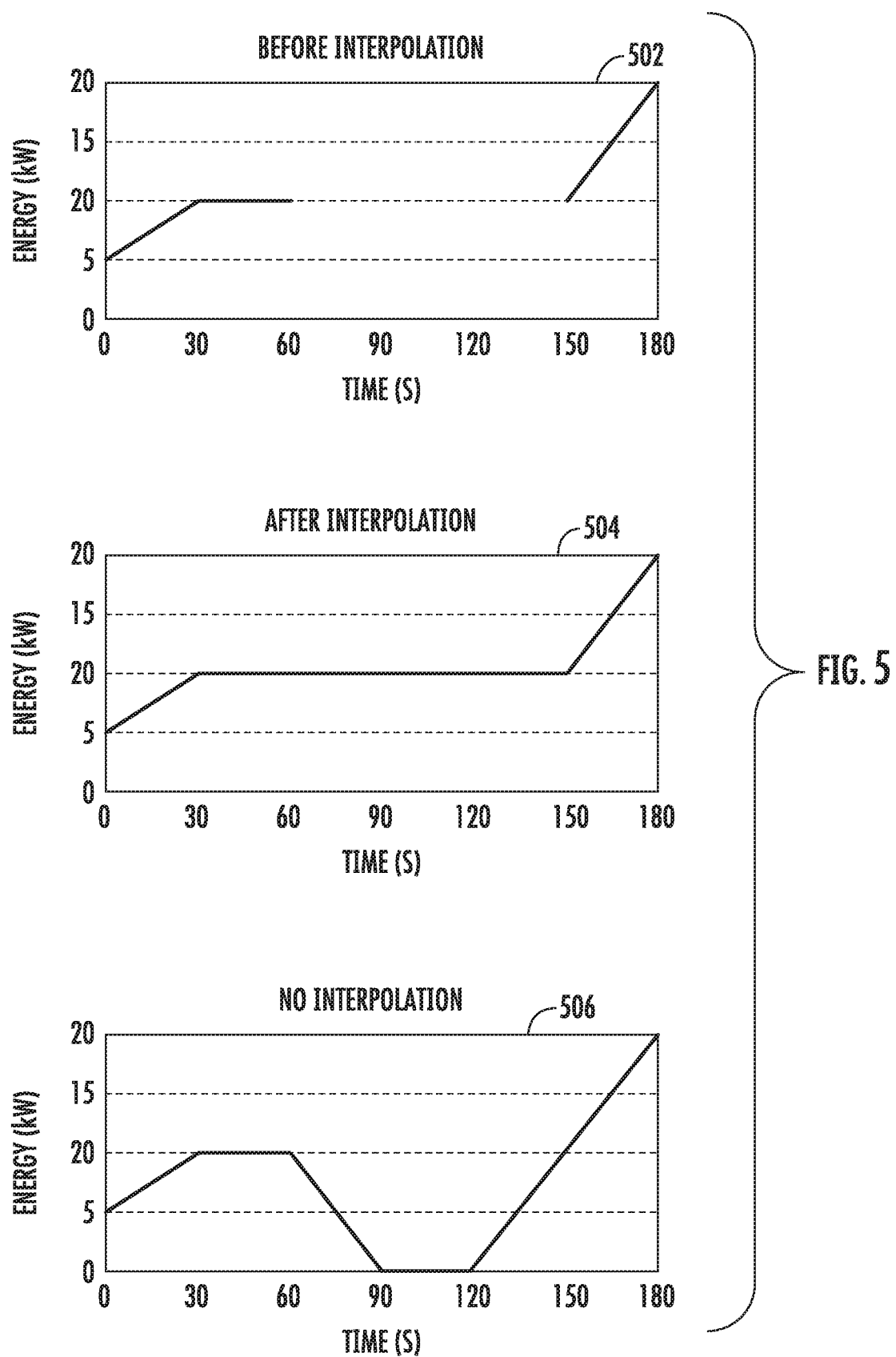
Figure 6:
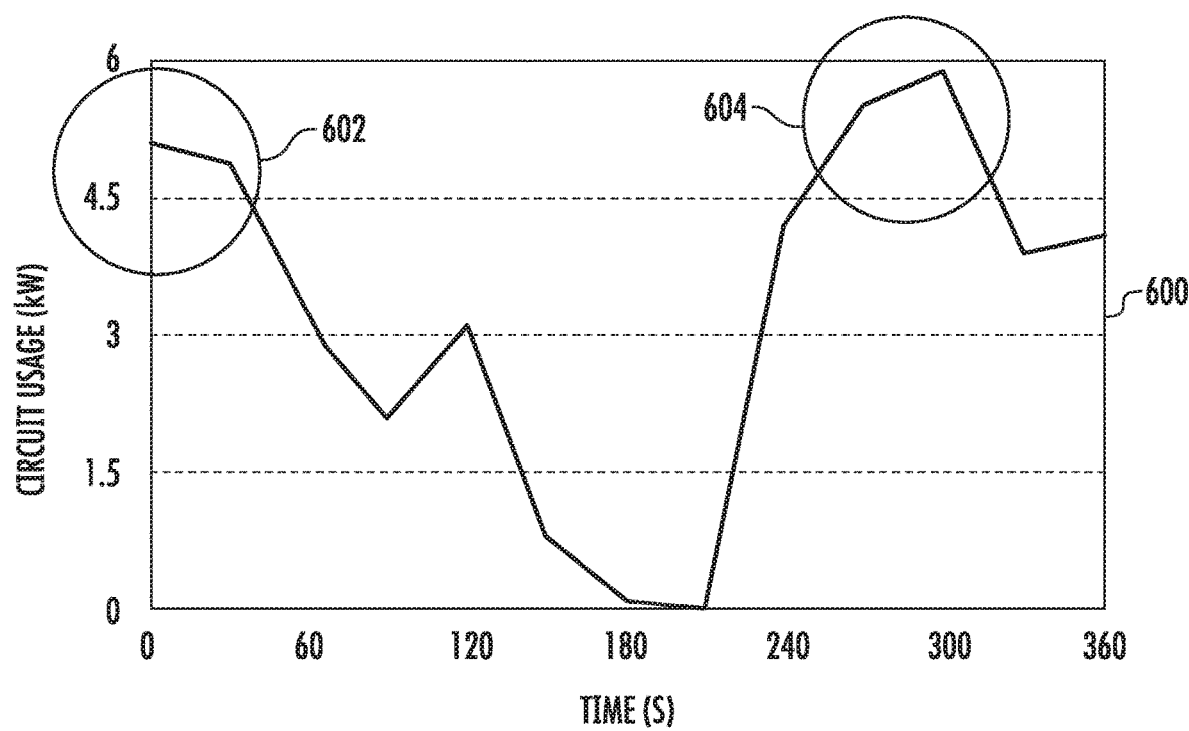
Figure 7:
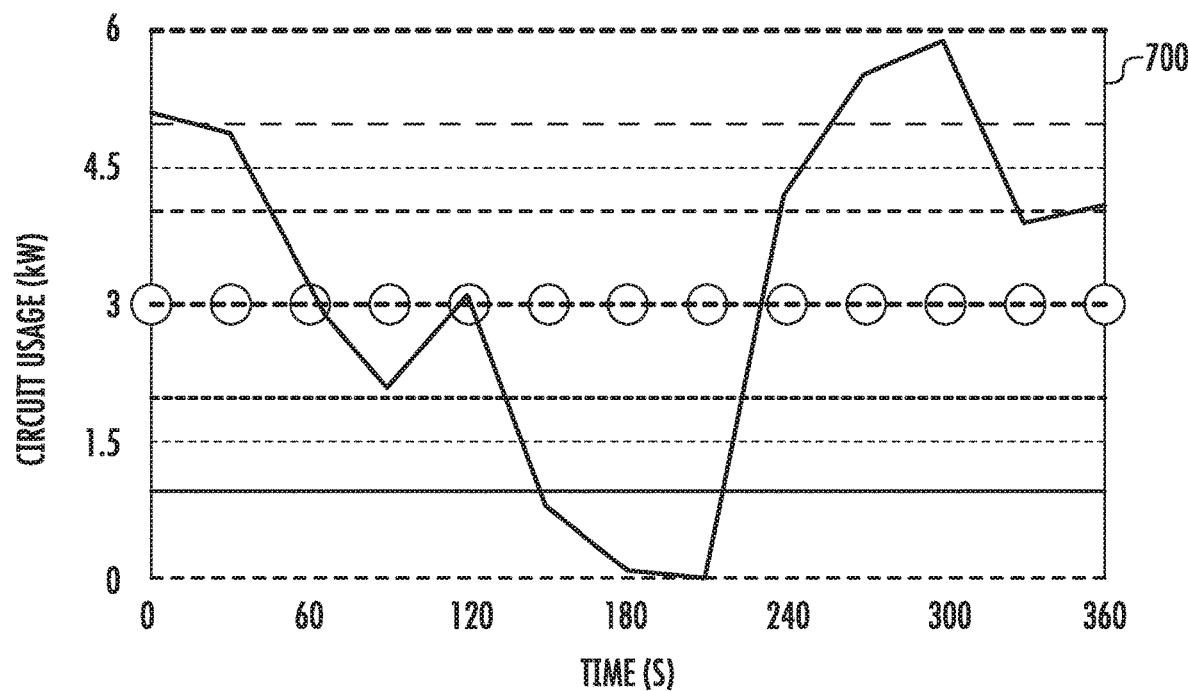
Figure 8:
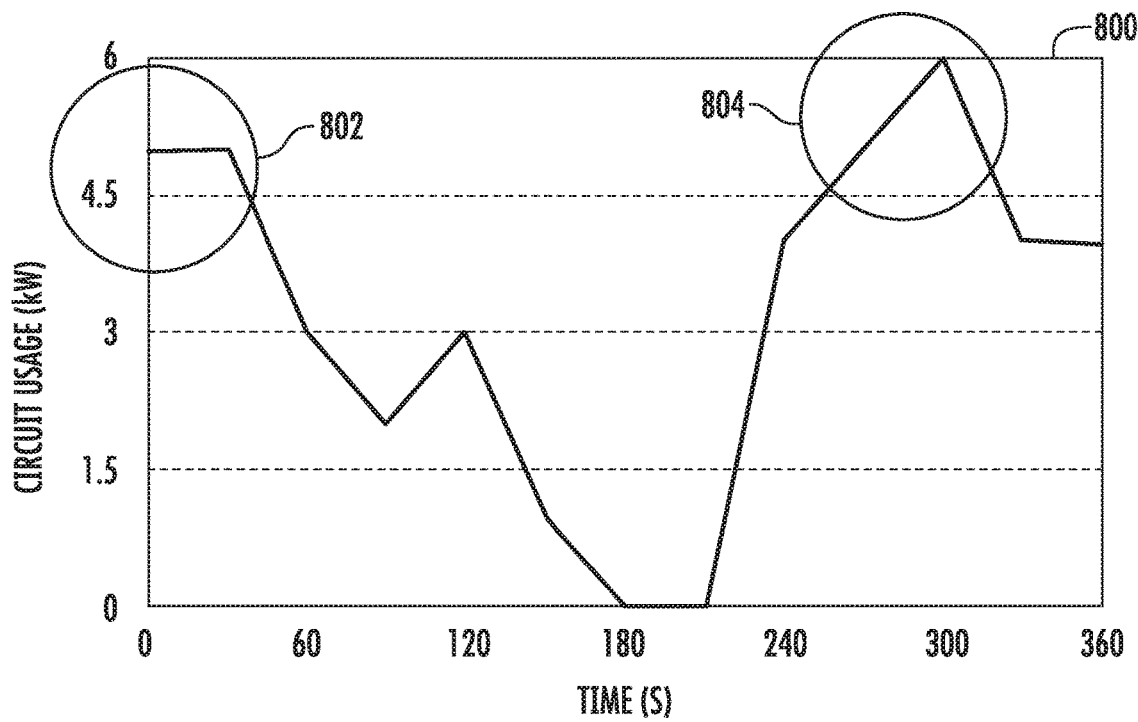
Figure 11:
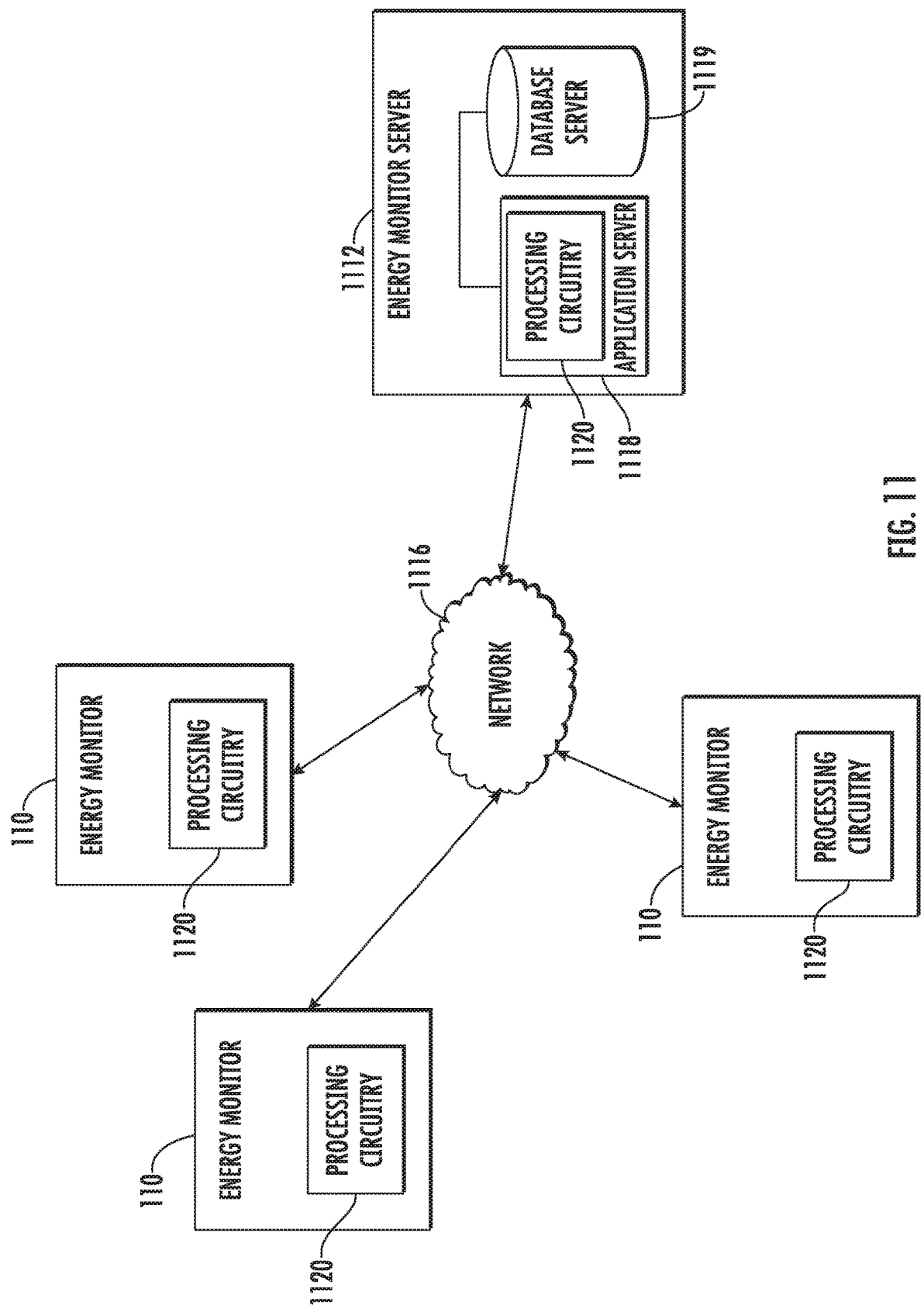
Figure 12:
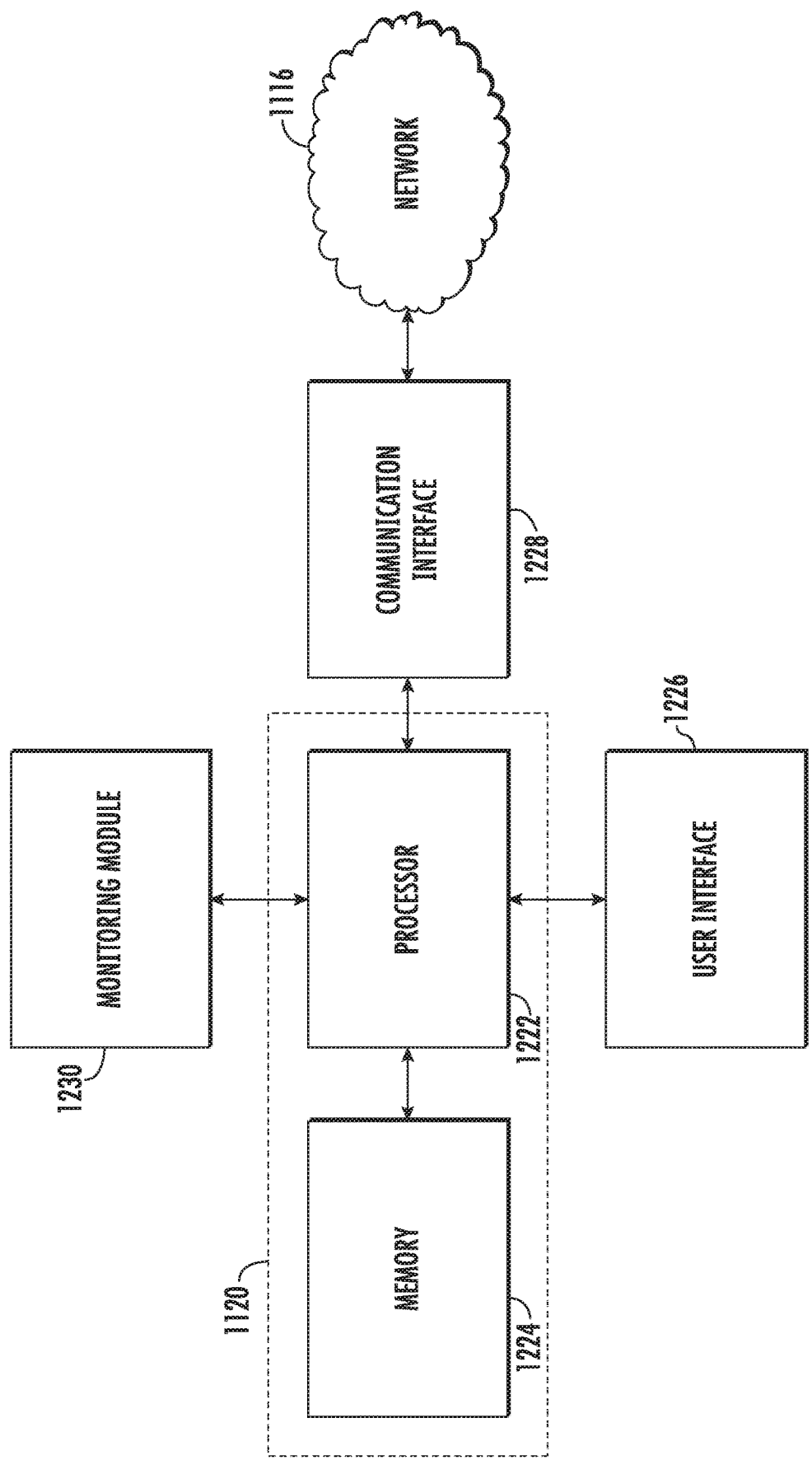
Figure 13:
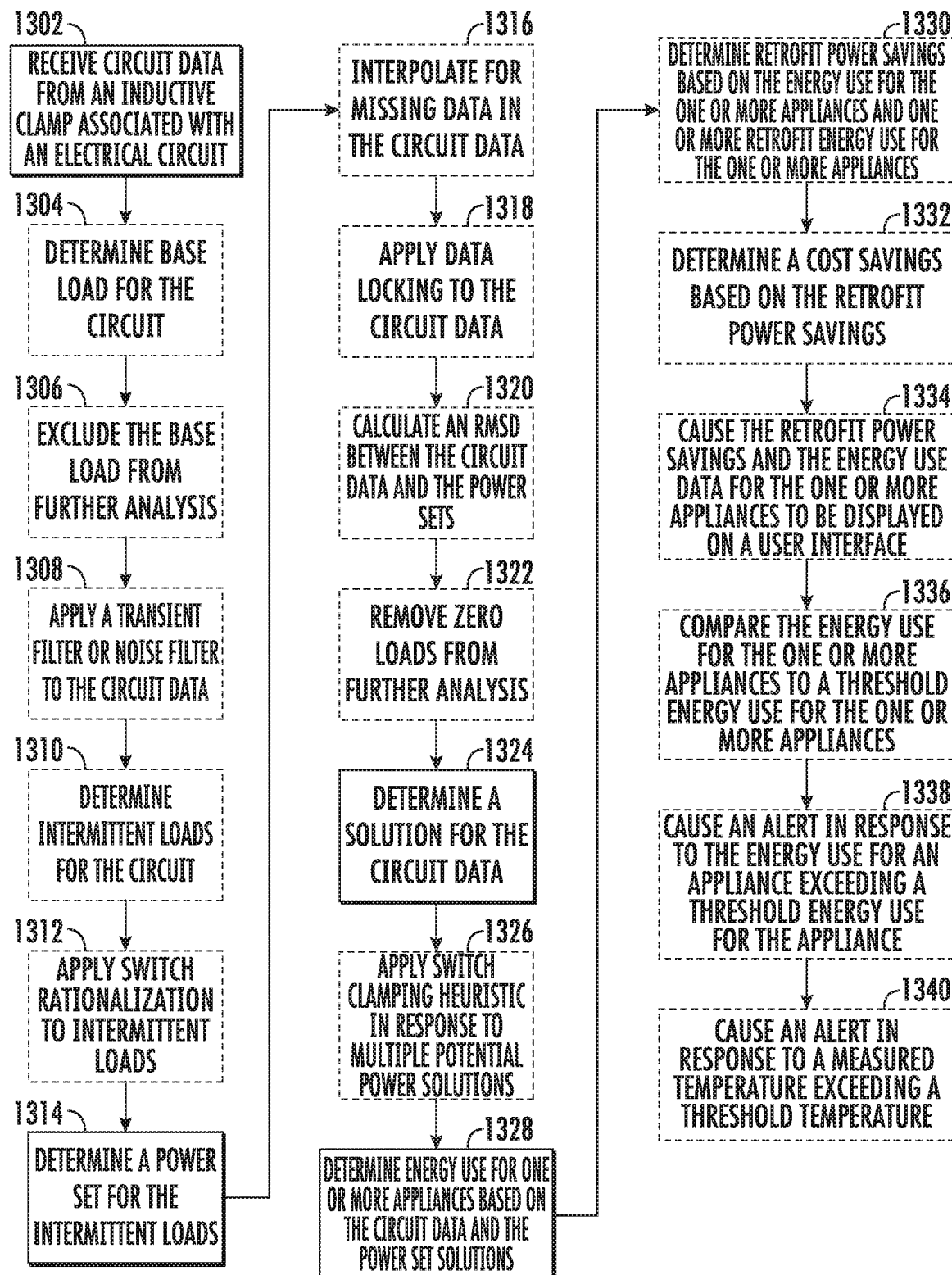

Having thus described the energy monitoring system in general terms, reference will now be made to the accompanying drawings, which are not necessarily drawn to scale, and wherein:

FIG. 1 illustrates an electrical distribution system according to an example embodiment;

FIG. 2 illustrates a prediction plot of energy usage according to an example embodiment;

FIG. 3 illustrates switch rationalization according to an example embodiment;

FIG. 4 illustrates Power Set determination according to an example embodiment;

FIG. 5 illustrates circuit data interpolation according to an example embodiment;

FIGS. 6-8 illustrate circuit data plots according to an example embodiment;

FIG. 9 illustrates an example appliance switch configuration according to an example embodiment;

FIG. 10 illustrates example solutions and runtimes for appliances according to an example embodiment;

FIG. 11 illustrates a block diagram of a monitoring system according to an example embodiment;

FIG. 12 illustrates a block diagram of an apparatus for energy monitoring according to an example embodiment; and FIG. 13 illustrates a method of energy monitoring according to an example embodiment.

DETAILED DESCRIPTION

Some example embodiments now will be described more fully hereinafter with reference to the accompanying drawings, in which some, but not all example embodiments are shown. Indeed, the examples described and pictured herein should not be construed as being limiting as to the scope, applicability or configuration of the present disclosure. Rather, these example embodiments are provided so that this disclosure will satisfy applicable legal requirements. Like reference numerals refer to like elements throughout. Furthermore, as used herein, the term "or" is to be interpreted as a logical operator that results in true whenever one or more of its operands are true.

As used in herein, the terms "component," "module," and the like are intended to include a computer-related entity, such as but not limited to hardware, firmware, or a combination of hardware and software. For example, a component or module may be, but is not limited to being, a process running on a processor, a processor, an object, an executable, a thread of execution, and/or a computer. By way of example, both an application running on a computing device and/or the computing device can be a component or module. One or more components or modules can reside within a process and/or thread of execution and a component/module may be localized on one computer and/or distributed between two or more computers. In addition, these components can execute from various computer readable media having various data structures stored thereon. The components may communicate by way of local and/or remote processes such as in accordance with a signal having one or more data packets, such as data from one component/ module interacting with another component/module in a local system, distributed system, and/or across a network such as the Internet with other systems by way of the signal. Each respective component/module may perform one or more functions that will be described in greater detail herein. However, it should be appreciated that although this example is described in terms of separate modules corresponding to various functions performed, some examples may not necessarily utilize modular architectures for employment of the respective different functions. Thus, for example, code may be shared between different modules, or the processing circuitry itself may be configured to perform all of the functions described as being associated with the components/modules described herein. Furthermore, in the context of this disclosure, the term "module" should not be understood as a nonce word to identify any generic means for performing functionalities of the respective modules. Instead, the term "module" should be understood to be a modular component that is specifically configured in, or can be operably coupled to, the processing circuitry to modify the behavior and/or capability of the processing circuitry based on the hardware and/or software that is added to or otherwise operably coupled to the processing circuitry to configure the processing circuitry accordingly.

Some example embodiments described herein provide an energy monitoring device and system. The energy monitoring system may include one or more inductive clamps which measure current load of an electrical circuit. Advantageously, the inductive clamp is placed around a wire in the electrical circuit without being wired to, or otherwise interfering with, the electrical circuit. The inductive clamp may be configured to transmit the current load as circuit data to an energy monitoring device, which may in turn, calculate energy savings made as a result of actual or theoretically retrofitting appliances. Additionally, the energy monitoring device may detect and classify circuit anomalies, such as tampering, fraud, appliance malfunction or the like.

The energy monitoring system may determine intermittent loads, such as appliances associated with each electrical circuit and determine a Power Set for the intermittent loads, e.g. loads which are not continuously operated at a steady power level, such as loads which are turned on and off by a switch or other controller. The Solution Sets of the Power Set may be the approximate current load associated with each intermittent load combination. In some embodiments, the energy monitoring system may rationalize for intermittent loads operated by a single switch, e.g. the intermittent loads sharing a switch may be treated as a single load for some or all of the energy use analysis.

The energy monitoring device may apply one or more processes to process the circuit data prior to analysis, such as interpolate for missing data, apply a noise or transient filter, apply data locking to Power Set level techniques to the circuit data, remove zero loads, or the like.

In an example embodiment, the energy monitoring device may determine energy use for one or more appliances associated with the electrical circuit by determining one or more Solution Sets for the circuit data, which identifies which appliances are operating based on the current load. In some example embodiments, the energy monitoring device may apply switch clamp heuristic in response to multiple potential solutions. The switch clamp heuristic may assume a solution based on minimal switch manipulation.

The energy monitoring device may determine retrofit power savings based on the energy use for the one or more appliance based on an assumed or known energy use for a retrofit appliance (e.g. post retrofit for circuits which have not been retrofitted or pre retrofit for circuits which have been retrofit). Additionally, the energy monitoring device may calculate the cost savings based on the retrofit power savings and an energy cost. The energy use, retrofit savings, and/or cost savings may be displayed on a user interface, for analytic purposes. In some embodiments, the energy monitoring device may compare the energy use data to a threshold energy use for one or more appliances and may cause an alert in response to exceeding the energy use threshold.

FIG. 1 illustrates an electrical distribution system according to an example embodiment. The electrical distribution system may include mains power 100 which supplies 110 VAC, 220 VAC, 440 VAC, or the like from an electrical power source, such as the electrical grid, generator, or other suitable power source. Mains power 100 may supply one or more electrical circuits 102 via an electrical cabling 106. Each of electrical circuits 102 may include one or more electrical loads, e.g. appliances 104.

One or more monitoring devices 110 may be installed to monitor the energy use of appliances 104 of electrical circuits 102. An inductive clamp 108 may be attached to each electrical circuit to be monitored. Inductive clamp 108 may be an energy harvesting wireless current clamp configured to measure the current load of electrical circuit 102. The inductive clamp may have a measurement range including, without limitation, 0-20 A, 0-60 A, 0-200 A, 0-600 A. In operation, inductive clamp 108 is placed around electrical cabling 106, without intruding on electrical circuit 102, e.g. the inductive clamp is not wired into the circuit. Current of electrical cabling 106 may induce current flow in inductive clamp 108. In an example embodiment, inductive clamp 108 may harvest the induced current to power inductive clamp 108 without a battery or external power supply.

Inductive clamp 108 may include processing circuitry 1120, such as discussed below in FIG. 11. Processing circuitry 1120 may be configured to collect circuit data based on the measured current load of electrical circuit 102. The circuit data may be measured and recorded in in current (amps) or power (watts) at a predetermined interval, such as 1 second, 5 seconds, 10 seconds, 20 seconds, 30 seconds, or the like. Inductive clamp 108 may transmit the circuit data to energy monitoring device 110, which may process the circuit data or may transmit the circuit data to a remote computing device, such as energy monitoring server 1112, discussed below in reference to FIG. 11, for processing. The circuit data may be transmitted via wired or wireless connection to energy monitoring device 110 as the circuit data is measured and collected, e.g. in real time, or as a "batch" at a predetermined interval. In some example embodiments, the circuit data may be transmitted from the inductive clamp 108 to energy monitoring device 110 via low powered radio protocols, such as an EnOcean radio at 902 MHz. The circuit data may be transmitted from energy monitoring device 110 to energy monitoring server 1112 via IP or TCP protocols, which may be carried on cellular, WiFi, Ethernet, or other backhaul network technology.

Inductive clamp 108 and/or energy monitoring device 110 may be associated with a unique identifier which may be a portion of, or transmitted with, the circuit data to identify electrical circuit 102, which the circuit data is associated. Inductive clamp 108 may transmit the circuit data in data packet, which may include an encoded amp-second value. The current load in amps may be derived by mathematically recording the arrival time of subsequent packets P1t and P2t and the amp-second values P1a and P2a contained in the encoded packets as follows:

$$\text{Amps} = (P2a - P1a)/(P2t - P1t) \qquad \text{EQN. 1}$$

Amps, in EQN. 1, represents the average current level during the intervening period between the transmission of the subsequent packets. EQN. 1 may compensate for missed packets by calculating average current level for a longer period.

In embodiments in which energy monitoring device 110 performs analysis based on power, e.g. watts, a nominal voltage may be assumed for the measured current load of the circuit data.

In some example embodiments the circuit data may be stored in memory, such as database server 1119 or memory 1224, as described below in reference to FIGS. 11 and 12.

The circuit data received by energy monitoring device 110 and/or energy monitoring server 1112 may include without limitation the circuit load value, a time stamp, and an identifier of inductive clamp 110 and/or energy monitoring device 110. The time stamp may include the date and time the circuit data was measured or recorded by inductive clamp 106. The identifier may be a unique address or identification code associated with inductive clamp 106 and/or energy monitoring device 110. The circuit data value may include a representation of the current load value associated with the specified time stamp and identifier.

Energy monitoring device 110 may be configured to determine energy use for one or more appliances, retrofit power savings, and or retrofit cost savings, as discussed below. The determinations of energy use, power savings, cost savings, or the like may be performed dynamically as the circuit data is received or at a predetermined interval, such as hourly, daily, weekly, monthly, quarterly, annually, once per billing period, or any other suitable interval.

In example embodiments, energy monitoring device 110 and/or energy monitoring server 1212 both perform the energy calculations discussed herein. In some embodiments, the energy monitoring device performs the energy calculations discussed herein and reports the results to energy monitoring server 1112. In still further embodiments, energy monitoring device 110 relays the circuit data from inductive clamp 108 to energy monitoring server 1112 for performance of the energy calculations. In yet another example, the energy calculations may be distributed between inductive clamp 108, energy monitoring device 110, and/or energy monitoring server 1112.

FIG. 2 illustrates a prediction plot 200 of energy usage according to an example embodiment. In some example embodiments, an appliance energy prediction is performed to determine applicability of retrofitting a particular circuit. The prediction may include power consumption, e.g. energy use, of electrical circuit 102 and/or the power consumption of a particular appliance(s) 104. The energy use may be in kWh from 0-30 kWh or other suitable energy use range based on appliances 104 on electrical circuit 102. The prediction may also include the efficiency factor for electrical circuit 102 and/or appliance 104, where efficiency factor (EF) is expressed as:

$$EF = \frac{PowerUsage_{existing} - PowerUsage_{retrofitted}}{PowerUsage_{existing}} \quad \text{EQN. 2}$$

A plot 202 is made with energy use of electrical circuit 102 on the x-axis against efficiency factor on the y-axis. Energy usage for electrical circuit 102 is plotted from 0 kWh to the maximum possible energy usage on electrical circuit 102 (30 kWh), the sum of all specified appliances 104 power consumptions, e.g. energy use. The total energy use for electrical circuit 102 may be expressed as:

$$\Sigma_{n=1}^{n=num_{appliance}} \text{power consumption} \quad \text{EQN. 3}$$

An average efficiency factor plot 204 may also be plotted on prediction plot 200. The smaller the area within the envelope, including the case where the envelope collapses to a straight line segment, the more optimal the circuit will be for the application of retrofitting. Additionally, the lower the average efficiency factor of the entire plot, the more optimal the circuit will be for the application of retrofitting.

Turning to the energy use calculations, energy monitoring device 110 and/or energy monitoring server 1112 may perform one or more of the processes, each of which are described in further detail below. The processes may use estimated energy uses for appliances 104 to determine actual energy use of appliances 104. The processes may include, without limitation, base load removal, median filtering, moving average smoothing, switch rationalization, Power Set determination, missing data interpolation, data locking, core disaggregation, and result interpretation. Core disaggregation may include removal of zero loads, determining a Solution Set(s), switch clamping, and selecting an optimal solution.

Base load removal may specify any appliances 104 on electrical circuit 102 that are continuously running, e.g. not able to be turned off. The specified continuously running appliances 104 and any current load associated with appliance 104 may be removed from subsequent processing. Additionally, appliance 104 and associated circuit data may be removed from retrofit power savings and retrofit cost savings calculations, since the retrofitting is specific to specified appliances.

Transient spikes, such as starting surges of appliances 104, and/or noise on electrical circuit 102 or circuit data may be filtered by applying median filtering, moving average smoothing, or other statistical methods.

Switch rationalization may be used in instances in which two or more appliances are controlled by the same switch. In the example depicted in FIG. 3, appliance A 306 and appliance B 308 are controlled by switch 1 302 and appliance C 310 is controlled by switch 2 304. Appliance A 306 may have an estimated power consumption of approximately 3 kW, appliance B 308 may have an estimated power consumption of approximately 3 kW, and appliance C 310 may have an estimated energy use of 5 kW. Switch rationalization may sum the approximate power consumption of each of the appliances controlled by a single switch. In the depicted example after rationalization appliance A, B 312 are treated as a single load with an estimated power consumption of approximately 5 kW and appliance C 314 remains the only appliance controlled by switch 2 302 with an estimated power consumption of approximately 5 kW. Switch rationalization may not be applied in an instance in which one or more appliances are controlled by multiple switches.

Solution Set(s) of the Power Set are a power consumption for a combination of appliances 104 running at the same time. Solution Sets may be determined by determining the estimated power consumption for each possible combination of appliances 104 on the electrical circuit 102. In the example depicted in FIG. 4, electrical circuit 102 includes appliance A 402 with an estimated power consumption of approximately 3 kW, appliance B 404 with an estimated power consumption of approximately 2 kW, and appliance C 406 with an estimated power consumption of approximately 1 kW. The estimated power consumption is summed, e.g.

total power consumption 410, for each possible combinations of appliances, e.g. Solution Sets 408.

The circuit data may include a predetermined number of data points for a day. For an example embodiment which operates with median filtering over 30 second periods, the circuit data may include 2880 data points. Missing data points may be interpolated to remain at the same value of the previous data point, be divided equally between the last known data point and the next known data point, or be assumed to be zero depending on the length of the period being interpolated. As depicted in FIG. 5, the data points for 90 s and 120 s are missing in the first data plot. Energy monitoring device 110 may interpolate the missing values as 10 kW, e.g. the value of the previous data point 60 s, as depicted in a second data plot 504. Without interpolation the value for 90 s and 120 s may default to zero giving an erroneously low power consumption, as depicted in a third data plot 506.

In some embodiments, interpolation of missing data may limited to missing data of less than a threshold period of time, such as 3 minutes, 5 minutes, or the like. The missing data may cause an error if the data is missing in excess of the threshold period of time. In some embodiments, the energy use, retrofit power savings, and retrofit cost savings may be calculated, but include an indication of the missing data error. Additionally, the periods of missing data may also indicate the absence of activity on the circuit rather than error conditions and during such periods the power consumption may be interpolated to zero in certain cases.

The circuit data may include power consumption of electrical circuit 102 which may vary over a period of time, such as a day. The power consumption data plot 600 of FIG. 6 depicts an example current usage over a period of 360 s, with power consumption from 0-6 kW. In some example embodiments, noise, inaccuracy of the current load measurement, equipment specifications, or the like, may cause the power consumption to be noisy and not the exact sum of the appliances currently operating. To assist in disaggregating the appliances for determining running appliances 104 on electrical circuit 102, locking of circuit data to known Power Set levels may be performed.

The power consumption values for the Solution Sets may be overlaid on the circuit data as depicted in the circuit use data plot 700 of FIG. 7. For each data point, such as data point 602 of approximately 4.9 kW and data point 604 of approximately 5.9 kW, the power consumption is "locked" or moved to the nearest power consumption for a Solution Set, e.g. a target disaggregation level. As depicted in FIG. 8, the power consumption plot 800 includes data point 802 which has been moved or locked to 5 kW and data point 804 which has been moved to 6 kW.

The incoming circuit data, e.g. power consumption, may not correspond exactly to the target disaggregation levels. A root mean square deviation (RMSD) measure may be performed to track the difference between the incoming and the target disaggregation level over a period of time.

$$RMSD = \sqrt{\frac{\sum_{t=1}^{n}(\hat{y}_t - y_t)^2}{n}}.$$

EQN. 4

In EQN 4, at time point t, $\hat{y}$ is the expected target disaggregation level and y is the power consumption. The power consumption values and target disaggregation level values may be summed across the day, then the square root applied to give the RMSD measure for the measured electrical circuit 102 for the day.

RMSD may be used for ascertaining accuracy of the disaggregation process, possibility of appliance malfunction, and possible measurement inaccuracy or tampering with the data gathering system, as described below.

Next, core disaggregation may be performed on the circuit data. The core disaggregation may be based on the Knapsack algorithm and a variant of the Subset Sum problem. For efficiency power consumption values of zero are not disaggregated. The power consumption for appliances 104 for a zero value circuit data is zero for all appliances on electrical circuit 102.

The nonzero power consumption values may be compared to the Solution Sets to determine a solution, e.g. a match between the Solution Set and the power consumption. Data locking the circuit data, as described above in reference to FIGS. 6-8 may add efficiency to the solution determination. Referring back to FIG. 4, if the power consumption was 4 kW the solution is appliances A,C. In an example embodiment, more than one potential Solution Set may be determined as the solution, for example, if the power consumption was 5 kW, the potential Solution Sets may include both appliances A,B and appliances A,C.

In response to multiple potential solutions, switch clamping may be applied. If multiple potential solutions persist after the application of switch clamping, the closest Solution Set in terms of absolute value may be chosen as the solution. Switch clamping may utilize the switch rationalization of the appliances 104 for electrical circuit 102 to determine a most likely Solution Set based on minimization of switch manipulations. The energy monitoring device 110 may track the switch positions for each Power Set solution. In an instance in which multiple potential solutions sets have been determined, the energy monitoring device 110 may select a Solution Set as the solution based on the lowest number of switch manipulations to achieve the Solution Set.

Turning to the example depicted in FIG. 9, if the circuit data indicates a power consumption of 5 kW for the first time point then appliance A,B 902 may be active and the energy monitoring device 110 may record that switch 1 is on and switches 2 and 3 (from appliance C 904 and appliance D 906) may be determined to be off.

If the next data point is 5 kW, then the energy monitoring device 110 may determine which combination of appliances is active as there are two potential solutions—(appliance A,B 902) and (appliance C 904, appliance D 906) both adding up to 5 kW. The energy monitoring device 110 may refer to the last determined solution, in which switch 1 was active and the energy monitoring device 110 may choose to minimize the number of switch manipulations, choosing the Solution Set of (appliance A,B 902) as the solution.

The basis of switch clamping is over small time periods and it is more likely that a minimum number of switch changes were made than a larger number of switch changes. Given two identical appliance combinations, it is therefore more likely that the one that involves the minimum number of switch changes is correct.

In an example embodiment in which switch clamping does not resolve any ambiguity, such as a case where the potential solutions sets involve the same number of switch changes, energy monitoring device 110 may look back at the pre-locked energy usage of electrical circuit 102 and compare that with the target disaggregation level. Since, the power consumption is a real number, the Solution Set with the closest target disaggregation level may be chosen as the solution based on a lowest absolute difference to the power consumption.

Energy monitoring device 110 may determine a solution for each data point as depicted by the disaggregated solutions 1002 of FIG. 10. The number of data points at which each appliance 104 is determined to be operating by the disaggregated solutions may be multiplied by the time interval between data points, e.g. 30 seconds, and a sum calculated for a total runtime for each appliance, as depicted by daily runtime chart 1104 of FIG. 10.

Using the runtime, power consumption, and efficiency factor for each appliance 104, retrofit power savings and retrofit cost savings may be determined either pre-retrofit to verify allocation of funds to perform the retrofit of one more appliances or after the retrofit to verify that appliance 104 is operating at the desired energy usage.

Energy use for each appliance 104 may be determined based on the power consumption of appliance 104 and the total run time. Post-retrofit energy usage may be calculated by EQN. 5.

$$\text{ApplianceEnergyUsage}_{PostRetrofit} = \text{RunTime}_{hours} \cdot \text{PowerConsumption}_{kWh} \quad \text{EQN. 5}$$

EQN 6 may be used to calculate the energy usage before the retrofitting process using the appliances efficiency factor (EF).

$$\text{ApplianceEnergyUsage}_{PreRetrofit} = \text{ApplianceEnergyUsage}_{PostRetrofit} \cdot \frac{1}{(1-EF)} \quad \text{EQN. 6}$$

And the savings in energy calculated as follows, $$\text{Savings}_{kWh} = \text{ApplianceEnergyUsage}_{PreRetrofit} - \text{ApplianceEnergyUsage}_{PostRetrofit} \quad \text{EQN. 7}$$

The combined retrofit energy use savings can therefore be calculated per appliance 104, per circuit 102, per site, or the like based on summation of the energy use and applications of EQNS 5-7. Additionally, a retrofit cost savings may also be calculated based on the energy cost per kWh.

$$\text{Retrofit cost savings} = \text{Savings} kWh \cdot \text{energy cost}/kWh \quad \text{EQN. 8}$$

The energy use, retrofit energy use savings, and retrofit cost savings may be collated in a database, such as memory 1224 or database server 1118 and subsequently retrieved for both the generation of a customer bill and display in graphical interface from which insight may be gained both into the performance of the system and of trends in RMSD measurement.

As discussed above, recording RMSD over time per site offers the ability to identify potentially fraudulent situations, malfunctions in the electrical system and/or appliances 104, and cases where the original measurement of current load values may not have been accurately measured due to a misreading, malfunctioning measurement equipment, or the like.

In a standard circuit 102 undergoing disaggregation, RMSD is expected to remain stable within a specific range or predetermined RMSD threshold, such as 1 standard deviation, that is particular to a given circuit (as it depends on circuit conditions, measurement accuracy, and to a degree electrical noise). The RMSD may be compared to the RMSD threshold, and in response to exceeding the RMSD threshold indicates, by causing an alert, and anomalous condition. The alert may include an audio alert, such as a buzzer, alarm, beep, horn, or the like. Additionally or alternatively, the alert may include a visual alert such as a light text message, email, or the like. A user may investigate the cause of the anomaly based on the RMSD alert.

In some embodiments, the energy monitoring device may compare the energy use data to a predetermined energy use threshold and cause an alert in response to exceeding the energy use threshold. Exceeding the energy use threshold may be indicative of an appliance failure or malfunction causing excess current load. The user may investigate the cause of exceeding the energy use threshold based on the energy use alert.

Additionally or alternatively, inductive clamp 108 may also include one or more sensors, such as a temperature sensor. The temperature sensor may measure the temperature of electrical cabling 106, which may be indicative of current flow. The measured temperature may be included in or with the circuit data. In instances of circuit failure or abnormality, excessively high or low current may flow through electrical cabling 106 causing a low or high temperature to be measured. The energy monitoring device may be further configured to compare the measured temperature to one or more predetermined temperature thresholds, such as a high temperature threshold set at a predetermined temperature above a measured normal operation temperature, such as three degrees, 5 degrees, or the like, and a low temperature threshold set at a predetermined temperature below the measured normal operation temperature. In response to the measured temperature exceeding the high or low temperature threshold, the energy monitoring device may cause an alert. The user may investigate the cause of exceeding the high or low temperature based on the alert to determine the cause. The temperature monitoring of the circuit, particularly when coupled with energy use data may provide early warning of circuit abnormalities, which may enable a user to determine a cause or take preventative measures prior to circuit failure.

Example—Processing Architecture

FIG. 11 illustrates an example system in which an embodiment of the present invention may be employed. The system may include one or more energy monitoring device 110. Each one of the energy monitoring device 110 may include or otherwise be embodied as computing device (e.g. a computer, a network access terminal, a personal digital assistant (PDA), or the like) capable of communication with a network 1116. As such, for example, each one of the energy monitoring device 110 may include (or otherwise have access to) memory for storing instructions or applications for the performance of various functions and a corresponding processor or processing circuitry 1120 for executing stored instructions or applications. Each one of energy monitoring device 110 may also include software and/or corresponding hardware for enabling the performance of the respective functions of energy monitoring device 110, as described below. In an example embodiment, one or more of energy monitoring device 110 may include a client application configured to operate in accordance with an example embodiment of the present invention. In this regard, for example, the client application may include software for enabling a respective one of energy monitoring device 110 to communicate with the network 1116 for requesting and/or receiving information and/or services via network 1116. Moreover, in some embodiments, the information or services that are requested via the network may be provided in software as a service (SAAS) environment. The information or services receivable at the client applications may include deliverable components (e.g. downloadable software to configure the energy monitoring device 110, or information for consumption/processing at the energy monitoring device 110).

Network 1116 may be a data network, such as a local area network (LAN), a metropolitan area network (MAN), a wide area network (WAN) (e.g. the Internet), and/or the like, which may couple energy monitoring device 110 to devices such as processing elements (e.g. personal computers, server computers, or the like) and/or databases. Communication between network 1116, energy monitoring device 110 and the devices or databases (e.g. servers) to which energy monitoring device 110 are coupled may be accomplished by either wireline or wireless communication mechanisms and corresponding communication protocols.

In an example embodiment, devices to which energy monitoring device 110 may be coupled via network 1116 may include one or more servers, e.g. application servers 1118 and/or database servers 1119. It is noted that the example embodiment of the system discussed herein is scalable to inclusion of any number of servers or energy monitoring device 110. Similarly, an energy monitoring server 1112 may have one or a plurality of application servers 1118 and/or database servers 1119. Although application server 1118 and database server 1119 are each referred to as "servers," this does not necessarily imply that they are embodied on separate servers or devices. As such, for example, a single server or device may include both entities and database server 1119 could merely be represented by a database or group of databases physically located on the same server or device as application server 1118. Application server 1118 and database server 1119 may each include hardware and/or software for configuring application server 1118 and database server 1119, respectively, to perform various functions. As such, for example, application server 1118 may include processing circuitry 1120, including a processor and memory enabling application server 1118 to access and/or execute stored computer readable instructions for performing various functions. In an example embodiment, one function that may be provided by application server 1118 may be the provision of access to information and/or services related to operation of the terminals or computers with which energy monitoring device 110 is associated. For example, application server 1118 may be configured to provide for storage of information descriptive of financial account data or product pricing data. In some cases, these contents may be stored in database server 1119. Alternatively or additionally, application server 1118 may be configured to provide analytical tools for use by energy monitoring device 110 in accordance with example embodiments.

In some embodiments, for example, application server 1118 may therefore include an instance of a monitoring module 1230, shown in FIG. 12, comprising stored instructions for handling activities associated with practicing example embodiments as described herein. As such, in some embodiments, energy monitoring device 110 may access the monitoring module 1230 online and utilize the services provided thereby. However, it should be appreciated that in other embodiments, monitoring module 1230 may be provided from application server 1118 (e.g. via download over network 1116) to one or more of the user devices to enable recipient use devices to instantiate an instance of monitoring module 1230 for local operation. As yet another example, monitoring module 1230 may be instantiated at one or more of energy monitoring devices 110 responsive to downloading instructions from a removable or transferable memory device carrying instructions for instantiating monitoring module 1230 at the corresponding one or more of energy monitoring device 110. In such an example, network 1116 may, for example, be a peer-to-peer (P2P) network where one of the user devices includes an instance of the monitoring module 1230 to enable the corresponding one of the user devices to act as a server to other user devices. In a further example embodiment, monitoring module 1230 may be distributed amongst one or more energy monitoring devices 110 and/or application server 1118.

In an example embodiment, application server 1118 may include or have access to memory (e.g. internal memory or database server 1119) for storing instructions or applications for the performance of various functions and a corresponding processor for executing stored instructions or applications. For example, the memory may store an instance of monitoring module 1230 configured to operate in accordance with an example embodiment of the present invention. In this regard, for example, monitoring module 1230 may include software for enabling application server 1118 to communicate with network 1116 and/or energy monitoring device 110 for the provision and/or receipt of information associated with performing activities as described herein. Moreover, in some embodiments, application server 1118 may include or otherwise be in communication with an access terminal (e.g. a computer including a user interface) via which analysts may interact with, configure or otherwise maintain the system.

In an example embodiment, the apparatus may include or otherwise be in communication with processing circuitry 1120 that is configured to perform data processing, application execution and other processing and management services according to an example embodiment of the present invention. In one embodiment, processing circuitry 1120 may include a memory 1224 and a processor 1222 that may be in communication with or otherwise control a user interface 1226 and a communication interface 1228. As such, processing circuitry 1120 may be embodied as a circuit chip (e.g. an integrated circuit chip) configured (e.g. with hardware, software or a combination of hardware and software) to perform operations described herein. However, in some embodiments, processing circuitry 1120 may be embodied as a portion of a server, computer, laptop, workstation or even one of various mobile computing devices. In situations where processing circuitry 1120 is embodied as a server or at a remotely located computing device, user interface 1226 may be disposed at another device (e.g. at a computer terminal or client device) that may be in communication with processing circuitry 1120 via the device interface 1228 and/or a network (e.g. network 1116).

User interface 1226 may be an input/output device for receiving instructions directly from a user. User interface 1226 may be in communication with processing circuitry 1120 to receive user input via user interface 1226 and/or to present output to a user as, for example, audible, visual, mechanical or other output indications. User interface 1226 may include, for example, a keyboard, a mouse, a joystick, a display (e.g. a touch screen display), a microphone, a speaker, or other input/output mechanisms. Further, processing circuitry 1120 may comprise, or be in communication with, user interface circuitry configured to control at least some functions of one or more elements of user interface 1226. Processing circuitry 1120 and/or user interface circuitry may be configured to control one or more functions of one or more elements of user interface 1226 through computer program instructions (e.g. software and/or firmware)

stored on a memory device accessible to processing circuitry 1120 (e.g. volatile memory, non-volatile memory, and/or the like). In some example embodiments, the user interface circuitry is configured to facilitate user control of at least some functions of the apparatus through the use of a display configured to respond to user inputs. Processing circuitry 1120 may also comprise, or be in communication with, display circuitry configured to display at least a portion of user interface 1226, the display and the display circuitry configured to facilitate user control of at least some functions of the apparatus.

Communication interface 1228 may be any device or circuitry embodied in either hardware, software, or a combination of hardware and software that is configured to receive and/or transmit data from/to a network and/or any other device or module in communication with the apparatus. Communication interface 1228 may also include, for example, an antenna (or multiple antennas) and supporting hardware and/or software for enabling communications with network 1116 or other devices (e.g. energy monitoring device 110). In some environments, communication interface 1228 may alternatively or additionally support wired communication. As such, for example, communication interface 1228 may include a communication modem and/or other hardware/software for supporting communication via cable, digital subscriber line (DSL), universal serial bus (USB) or other mechanisms. In an exemplary embodiment, communication interface 1228 may support communication via one or more different communication protocols or methods. In some cases, IEEE 802.15.4 based communication techniques such as ZigBee or other low power, short range communication protocols, such as a proprietary technique based on IEEE 802.15.4 may be employed along with radio frequency identification (RFID) or other short range communication techniques.

In an example embodiment, memory 1224 may include one or more non-transitory storage or memory devices such as, for example, volatile and/or non-volatile memory that may be either fixed or removable. Memory 1224 may be configured to store information, data, applications, instructions or the like for enabling the apparatus to carry out various functions in accordance with example embodiments of the present invention. For example, memory 1224 could be configured to buffer input data for processing by processor 1222. Additionally or alternatively, memory 1224 could be configured to store instructions for execution by processor 1222. As yet another alternative, memory 1224 may include one of a plurality of databases (e.g. database server 1119) that may store a variety of files, contents or data sets. Among the contents of memory 1224, applications (e.g. client applications or service application) may be stored for execution by processor 1222 in order to carry out the functionality associated with each respective application.

Processor 1222 may be embodied in a number of different ways. For example, processor 1222 may be embodied as various processing means such as a microprocessor or other processing element, a coprocessor, a controller or various other computing or processing devices including integrated circuits such as, for example, an ASIC (application specific integrated circuit), an FPGA (field programmable gate array), a hardware accelerator, or the like. In an example embodiment, processor 1222 may be configured to execute instructions stored in the memory 1224 or otherwise accessible to processor 1222. As such, whether configured by hardware or software methods, or by a combination thereof, processor 1222 may represent an entity (e.g. physically embodied in circuitry) capable of performing operations according to embodiments of the present invention while configured accordingly. Thus, for example, when processor 1222 is embodied as an ASIC, FPGA or the like, processor 1222 may be specifically configured hardware for conducting the operations described herein. Alternatively, as another example, when processor 1222 is embodied as an executor of software instructions, the instructions may specifically configure processor 1222 to perform the operations described herein.

In an example embodiment, processor 1222 (or processing circuitry 1120) may be embodied as, include or otherwise control monitoring module 1230, which may be any device or circuitry operating in accordance with software or otherwise embodied in hardware or a combination of hardware and software (e.g. processor 1222 operating under software control, processor 1222 embodied as an ASIC or FPGA specifically configured to perform the operations described herein, or a combination thereof) thereby configuring the device or circuitry to perform the corresponding functions of monitoring module 1230, as described below.

Monitoring module 1230 may include tools to facilitate energy monitoring via network 1116. In an example embodiment, monitoring module 1230 may be configured to receive circuit data including the measured current from the inductive clamp, determine a Power Set for one or more intermittent loads associated with the electric circuit based at least in part on the circuit data, determine a solution for the circuit data based on determined Solution Sets of the Power Set, and determine an energy usage for an appliance based on the solution.

Example Method

FIG. 13 illustrates a block diagram of some activities that may be associated with one example of a method in accordance with the invention. In some embodiments, processing circuitry 1120 (which may include a processor capable of executing instructions stored in a non-transitory computer readable medium/memory) may be configured to implement a control algorithm for the monitoring device according to the method.

In an example embodiment, the method may include receiving circuit data from an inductive clamp associated with an electrical circuit at operation 1302, a Power Set for the intermittent loads at operation 1314, determining a solution for the circuit data at operation 1324, and determining energy use for one or more appliances based on the circuit data and at operation 1328.

In some embodiments, the method may include additional, optional operations, and/or the operations described above may be modified or augmented. Some examples of modifications, optional operations, and augmentations are described below, as indicated by dashed lines, such as, determining a base load for the circuit at operation 1304 and excluding the base load form further analysis at operation 1306. In some example embodiments, the method may include applying a transient or noise filter to the circuit data at operation 1308, determining intermittent circuit loads at operation 1310, or applying switch rationalization to the intermittent loads at operation 1312. In an example embodiment, the method may include interpolating for missing data in the circuit data at operation 1316, applying data locking to the circuit data at operation 1318, and calculating an RMSD between the circuit data and the Solution Sets at operation 1320. In some example embodiments, the method may include removing zero loads from further analysis at operation 1322, applying switch clamping heuristic in response to multiple potential power solutions at operation 1326, and determining retrofit power savings based on the energy use for one or more appliances and the retrofit energy use for the one or more appliances at operation 1330. In an example embodiment, the method may include determining a cost savings based on the retrofit power savings at operation 1332 and causing the retrofit power savings and the energy use data to be displayed on a user interface at operation 1334. In an example embodiment, the method may also include comparing the energy use for the one or more appliances to a threshold energy use for one or more appliances at operation 1336 and cause an alert in response to the energy use for an appliance exceeding a threshold energy for the appliance at operation 1338. In an example embodiment, the method may also include causing an alert in response to a measured temperature exceeding a temperature threshold at operation 1340.

In an example embodiment, the energy monitor may comprise a processor (e.g. processor 1222) or processing circuitry 1120 configured to perform some or each of the operations (1302-1340) described above. Processor 1222 may, for example, be configured to perform the operations (1302-1340) by performing hardware implemented logical functions, executing stored instructions, or executing algorithms for performing each of the operations. In some embodiments, processor 1222 or processing circuitry 1120 may be further configured for additional operations or optional modifications to operations 1302-1340. In this regard, in an example embodiment, the energy monitoring system also includes a wireless gateway configured to receive the circuit data from the inductive clamps and transmit the circuit data to the monitoring device using wireless communication. In some example embodiments, the memory and the computer program code are further configured to determine a base load for the circuit and exclude the base load from further analysis. In an example embodiment, the memory and the computer program code are further configured to apply a transient or noise filter to the circuit data. In some example embodiments, wherein the memory and the computer program code are further configured to determine the intermittent loads for the electrical circuit. In an example embodiment, determining Solution Sets for the one or more intermittent loads further comprises applying switch rationalization to the circuit data. In some example embodiments, the memory and the computer program code are further configured to interpolate for missing data in the circuit data. In an example embodiment, determining the solution comprises applying data locking to the current data. In some example embodiments, the memory and the computer program code are further configured to calculate an RMSD between the circuit data and the Power Sets. In an example embodiment, determining the solution comprises applying switch clamping heuristic in response to multiple potential power solutions. In some example embodiments, the memory and the computer program code are further configured to determine retrofit power savings based on the energy use of the appliance and a retrofit energy use for the appliance. In an example embodiment, the memory and the computer program code are further configured to cause the retrofit power savings and the power use of the appliance to be displayed on a user interface. In some example embodiments, the memory and the computer program code are further configured to compare the energy use or RMSD for the appliance to a threshold energy use or threshold RMSD for the appliance and cause an alert in response to the energy use or RMSD for the appliance exceeding a threshold energy use or RMSD for the appliance.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. In cases where advantages, benefits or solutions to problems are described herein, it should be appreciated that such advantages, benefits and/or solutions may be applicable to some example embodiments, but not necessarily all example embodiments. Thus, any advantages, benefits or solutions described herein should not be thought of as being critical, required or essential to all embodiments or to that which is claimed herein. Although specific terms are employed herein, they are used in a generic and descriptive sense only and not for purposes of limitation.

That which is claimed:

1. An energy monitoring system comprising:
   a device associated with an electric circuit and configured to measure current load of the electric circuit; and
   an energy monitoring device comprising a processor and a memory including computer program code, the memory and the computer programming code configured to, with the processor, cause the monitoring device to:
   receive circuit data including the measured current from the device;
   determine a Power Set for one or more intermittent loads associated with the electric circuit based at least in part on the circuit data;
   determine a solution for the circuit data based on determined Solution Sets of the Power Set; and
   determine an energy usage for an appliance based on the solution.

2. The energy monitoring system of claim 1, further comprising:
   a wireless gateway configured to receive the circuit data from the device and transmit the circuit data to the monitoring device using wireless communication.

3. The energy monitoring system of claim 1, wherein the memory and the computer program code are further configured to:
   determine a base load for the circuit; and
   exclude the base load from further analysis.

4. The energy monitoring system of claim 1, wherein the memory and the computer program code are further configured to:
   apply a transient or noise filter to the circuit data.

5. The energy monitoring system of claim 1, wherein the memory and the computer program code are further configured to:
   determine the intermittent loads for the electrical circuit.

6. The energy monitoring system of claim 1, wherein determining the Solution Sets for the one or more intermittent loads further comprises applying switch rationalization to the intermittent loads.

7. The energy monitoring system of claim 1, wherein the memory and the computer program code are further configured to:
interpolate for missing data in the circuit data.

8. The energy monitoring system of claim 1, wherein determining the solution comprises applying data locking to the current data.

9. The energy monitoring system of claim 1, wherein the memory and the computer program code are further configured to:
calculate an RMSD between the circuit data and the Solution Sets.

10. The energy monitoring system of claim 1, wherein determining the solution comprises applying switch clamping heuristic in response to multiple Solution Sets.

11. The energy monitoring system of claim 1, wherein the memory and the computer program code are further configured to:
determine retrofit power savings based on the energy use of the appliance and a retrofit energy use for the appliance.

12. The energy monitoring system of claim 11, wherein the memory and the computer program code are further configured to:
cause the retrofit power savings and the power use of the appliance to be displayed on a user interface.

13. The energy monitoring system of claim 1, wherein the memory and the computer program code are further configured to:
compare the energy use or RMSD for the appliance to a threshold energy use or threshold RMSD for the appliance; and
cause an alert in response to the energy use or RMSD for the appliance exceeding a threshold energy use or threshold RMSD for the appliance.

14. An energy monitoring device comprising:
a processor and a memory including computer program code, the memory and the computer programming code configured to, with the processor, cause the monitoring device to:
receive circuit data including the measured current from a device associated with an electric circuit and configured to measure current drawn by the electric circuit, wherein the circuit data is received via a wireless gateway configured to wirelessly communicate the circuit data from the device to the energy monitoring device;
determine a Power Set for one or more intermittent loads associated with the electric circuit based at least in part on the circuit data;
determine a solution for the circuit data based on determined Solution Sets of the Power Set;
determine an energy usage for an appliance based on the solution; and
determine a retrofit power savings based on the energy usage for the appliance and a retrofit energy use for the appliance.

15. The energy monitoring device of claim 14, wherein the memory and the computer program code are further configured to:
determine the intermittent loads for the electrical circuit, and
wherein determining the Solution Sets for the one or more intermittent loads further comprises applying switch rationalization to the intermittent loads.

16. The energy monitoring device of claim 14, wherein the memory and the computer program code are further configured to:
interpolate for missing data in the circuit data; and
apply data locking to the current data.

17. The energy monitoring device of claim 14, wherein determining the solution comprises applying switch clamping heuristic in response to multiple potential power solutions.

18. The energy monitoring device of claim 14, wherein the memory and the computer program code are further configured to:
calculate an RMSD between the circuit data and the Solution Sets.

19. The energy monitoring device of claim 14, wherein the memory and the computer program code are further configured to:
compare the energy use or RMSD for the appliance to a threshold energy use or RMSD for the appliance; and
cause an alert in response to the energy use or threshold RMSD for the appliance exceeding a threshold energy use or threshold RMSD for the appliance.

20. The energy monitoring device of claim 14, wherein the memory and the computer program code are further configured to:
determine a cost savings based on the retrofit power savings.

* * * * *